US012205665B2

(12) United States Patent
Akarvardar et al.

(10) Patent No.: US 12,205,665 B2
(45) Date of Patent: Jan. 21, 2025

(54) THREE DIMENSIONAL MEMORY DEVICE AND METHOD FOR MANUFACTURING THE SAME

(71) Applicant: TAIWAN SEMICONDUCTOR MANUFACTURING COMPANY LTD., Hsinchu (TW)

(72) Inventors: Murat Kerem Akarvardar, Hsinchu (TW); Xiaochen Peng, San Jose, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 184 days.

(21) Appl. No.: 18/155,078

(22) Filed: Jan. 17, 2023

(65) Prior Publication Data

US 2024/0203463 A1 Jun. 20, 2024

Related U.S. Application Data

(60) Provisional application No. 63/387,505, filed on Dec. 15, 2022.

(51) Int. Cl.
*G11C 7/10* (2006.01)
(52) U.S. Cl.
CPC ................................ *G11C 7/1012* (2013.01)
(58) Field of Classification Search
CPC ..................................................... G11C 7/1012

USPC ....................................................... 365/189.02
See application file for complete search history.

(56) References Cited

U.S. PATENT DOCUMENTS

| 6,862,224 B2 * | 3/2005 | Stubbs | G11C 7/1039 365/230.02 |
|---|---|---|---|
| 2007/0245217 A1 * | 10/2007 | Valle | H03M 13/658 714/758 |
| 2015/0121052 A1 * | 4/2015 | Emma | G06F 9/44 713/1 |
| 2023/0028270 A1 * | 1/2023 | Yang | H03L 7/093 |
| 2023/0051480 A1 * | 2/2023 | Zaidy | G06F 13/1673 |

* cited by examiner

*Primary Examiner* — Fernando Hidalgo
(74) *Attorney, Agent, or Firm* — WPAT LAW; Anthony King

(57) ABSTRACT

A 3D memory device is provided. The 3D memory device includes a first logic base layer, a second layer, and a third layer. The first logic base layer comprises a first type DEMUX, a plurality of second type DEMUXs coupled to the first type DEMUX, a first type MUX, and a plurality of second type MUXs coupled to the first type MUX. The second layer comprises a first group of memory units. Each of the first group of memory units is respectively coupled to a corresponding DEMUX of the plurality of second type DEMUXs and a corresponding MUX of the plurality of second type MUXs. The third layer comprises a second group of memory units. Each of the second group of memory units is respectively coupled to a corresponding DEMUX of the plurality of second type DEMUXs and a corresponding MUX of the plurality of second type MUXs.

20 Claims, 6 Drawing Sheets

601 Providing a logic base layer, wherein the logic base layer comprises a first type DEMUX, a plurality of second type DEMUXs, a first type MUX, and a plurality of second type MUXs 602 Providing a second layer on the logic base layer, wherein the second layer comprises a first group of memory units, wherein each of the first group of memory units is respectively coupled to a corresponding DEMUX of the plurality of second type DEMUXs and wherein each of the first group of memory units is respectively coupled to a corresponding MUX of the plurality of second type MUXs 603 Providing a third layer on the second layer, wherein the third layer comprises a second group of memory units, wherein each of the second group of memory units is respectively coupled to a corresponding DEMUX of the plurality of second type DEMUXs and wherein each of the second group of memory units is respectively coupled to a corresponding MUX of the plurality of second type MUXs

FIG. 6

THREE DIMENSIONAL MEMORY DEVICE AND METHOD FOR MANUFACTURING THE SAME

PRIORITY CLAIM AND CROSS-REFERENCE

This application claims the benefit of prior-filed provisional application No. 63/387,505, filed on 15 Dec. 2022.

TECHNICAL FIELD

The present disclosure relates, in general, to a three dimensional (3D) memory device and method of manufacturing the same. Specifically, the present disclosure relates to an improved fine-grain 3D memory device and method of manufacturing the same.

BACKGROUND

In modern use, many applications require high density and high performance 3D memory (e.g., SRAM, DRAM, NVM). However, the existing 3D stacked configuration normally utilized suffers from unfavorable footprint and performance. Existing 3D memory device use a layer-select demultiplexer and collect data using a layer-select multiplexer. An improved fine-grain 3D memory device is thus called for.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 6 is a flowchart of an embodiment of a method of manufacturing a 3D memory device in accordance with some embodiments of the present disclosure.

DETAILED DESCRIPTION

Figure 1:
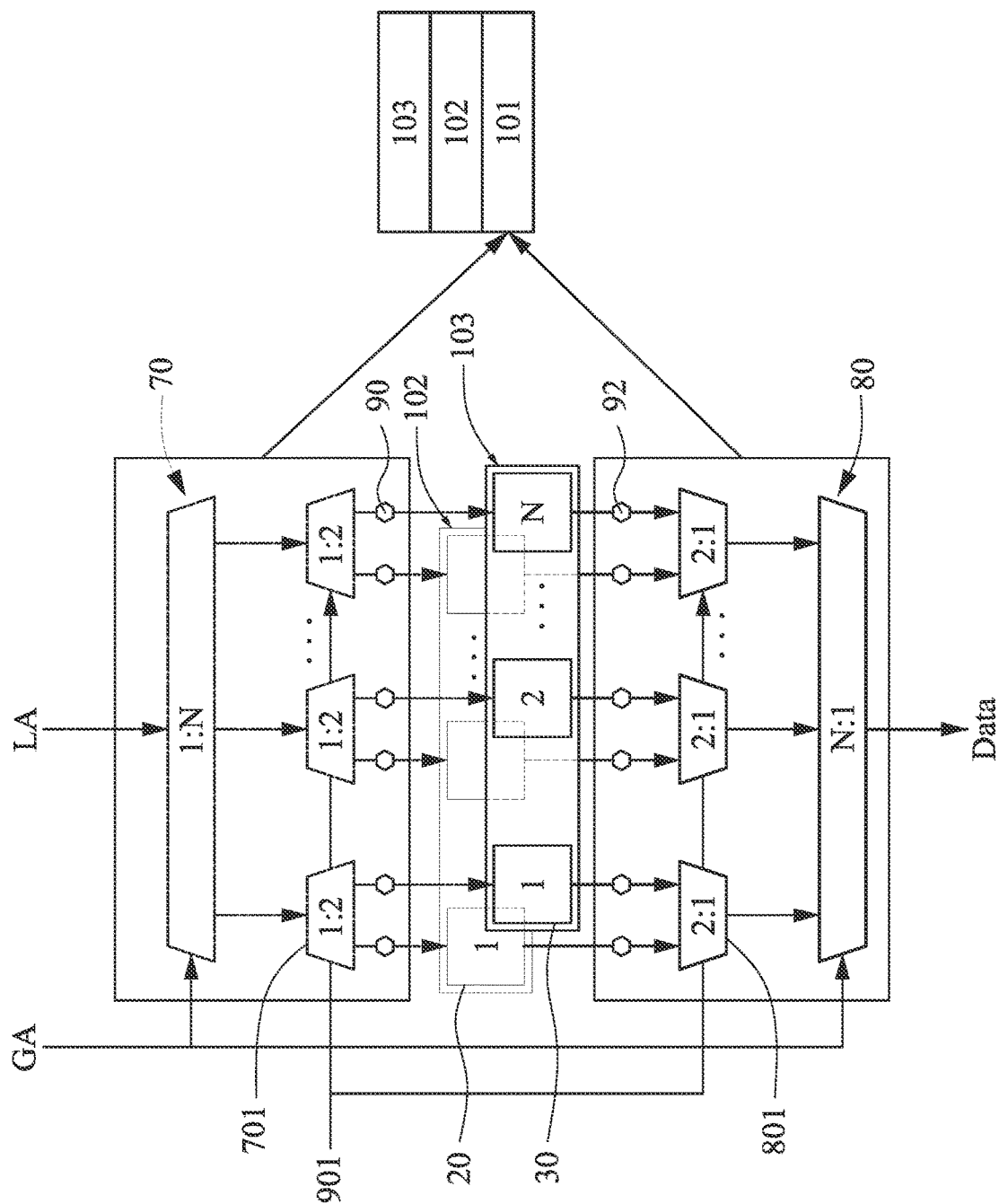
FIG. 1 shows a 3D memory device in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure provides a fine-grain 3D memory device, in which logic tech nodes can be separately selected for the logic based and memory layers based on need. The present disclosure provides a total stack of the memory layers comprising m+1 layers (that is, m memory layers in addition to one logic base layer).

FIG. 1 shows a 3D memory device 1 in accordance with some embodiments of the present disclosure. The 3D memory device 1 includes a layer 101, a layer 102 disposed on the layer 101, and a layer 103 disposed on the layer 102. In some embodiments, the layer 101 is a logic base layer. In some embodiments, the layer 101 includes a first type demultiplexer (DEMUX) 70, a plurality of second type DEMUXs 701 coupled to the first type DEMUX 70, a first type multiplexer (MUX) 80, and a plurality of second type MUXs 801 coupled to the first type MUX 80.

Each of the plurality of second type DEMUXs 701 has two output terminals and each of the plurality of second type MUXs 801 has two input terminals. In some embodiments, each of the plurality of second type DEMUXs 701 may have m number of output terminals and each of the plurality of second type MUXs 801 may have m number of input terminals. In some embodiments, m is an integer larger than or equal to 2. A global address (GA) signal is input to the DEMUX 70 and MUX 80. A local address (LA) signal is input to the DEMUX 70. A selection signal 901 is input to each of the plurality of second type DEMUXs 701 and each of the plurality of second type MUXs 801. The data is output from the MUX 80 in the layer 101.

In some embodiments, the layer 102 includes a first group of memory units 20. The first group of memory units 20 includes a plurality of memory units 20. The layer 102 is a layer having memory units only. Each of the first group of memory units 20 is respectively coupled to a corresponding DEMUX 701 of the plurality of second type DEMUXs 701 and a corresponding MUX 801 of the plurality of second type MUXs 801. Each of the first group of memory units is respectively coupled to a corresponding output terminal of the m number of output terminals of the plurality of second type DEMUXs 701.

In some embodiments, the layer 103 includes a second group of memory units 30. The second group of memory units 30 includes a plurality of memory units. The layer 103 is a layer having memory units only. Each of the second group of memory units 30 is respectively coupled to a corresponding DEMUX 701 of the plurality of second type DEMUXs 701 and a corresponding MUX 801 of the plurality of second type MUXs 801. In some embodiments, each of the second group of memory units 30 is respectively coupled to a corresponding input terminal of the m number of input terminals of the plurality of second type MUXs 801. In some embodiments, the layer 102 and the layer 103 are selected by a selection signal 901 input to each of the plurality of second type DEMUXs 701 and each of the plurality of second type MUXs 801.

In some embodiments, the plurality of second type DEMUXs 701 includes N number of DEMUXs 701 and the plurality of second type MUX 801 N number of MUXs 801. In some embodiments, N is the number of memory units 20 and the memory units 30. In some embodiments, N is an integer larger than or equal to 2. In some embodiments, the first type DEMUX 70 is a 1-to-N DEMUX and the first type MUX 80 is a N-to-1 MUX. In some embodiments, N is the number of first group of memory units 20 and the second group of memory units 30. Each of the memory units 20 can be individually accessed by using the N number of 1-to-2 DEMUXs 70 and the N number of 2-to-1 MUXs 80. The large peripherals of the layer 101 are located at the bottommost layer. In some embodiments, the logic base is moved under the memory stack including layers 102 and 103.

The N number of MUXs 801 and DEMUXs 701 having a plurality of vertical inter-layered interconnects (TSV/SoIC bonding) may have shorter routing. The present disclosure provides a fine-grain memory device having the small peripherals (logic base layer) under the plurality of stacked memory layers, since the peripherals (logic base layer) are all located at the bottom layer.

For a fine-grain 3D memory device, the logic tech nodes (for the logic base and SRAM stack) can be separately selected based on need. The present disclosure provides a total of m+1 layers (that is, m memory layers in addition to one logic base layer). The folded and hidden peripherals in a logic base layer are under the memory unit layer. The present disclosure keeps the large peripherals (1-to-N DEMUX and N-to-1 MUX) only at the bottom layer. The present disclosure provides the N number of m-to-1 MUXs 801 and the N number of 1-to-m DEMUXs 701 for each of the stacked memory units 20 or stacked memory units 30.

In some embodiments, each of the plurality of second type DEMUXs 701 is a 1-to-2 DEMUX and each of the plurality of second type MUXs 801 is a 2-to-1 MUX. In some embodiments, m is an integer larger than or equal to 2. In some embodiments, m is an integer corresponding to the number of the layers disposed on the layer 101. In some embodiments, m may be 2, which corresponds to the number (2) of two layers 102 and 103 disposed on the layer 101. In some embodiments, m is an integer larger than or equal to 2. In some embodiments, each of the plurality of second type DEMUXs 701 is a 1-to-m DEMUX and each of the plurality of second type MUXs 801 is a m-to-1 MUX.

In some embodiments, a first output terminal of a DEMUX 701 of the plurality of second type DEMUXs 701 is coupled to an input terminal of one of the first group of memory units 20. In some embodiments, a second output terminal of the DEMUX 701 of the plurality of second type DEMUXs 701 is coupled to an input terminal of one of the second group of memory units 30. In some embodiments, a first input terminal of a MUX 801 of the plurality of second type MUXs 801 is coupled to an output terminal of one of the first group of memory units 20. In some embodiments, a second input terminal of the MUX 801 of the plurality of second type MUXs 801 is coupled to an output terminal of one of the second group of memory units 30.

Figure 4:
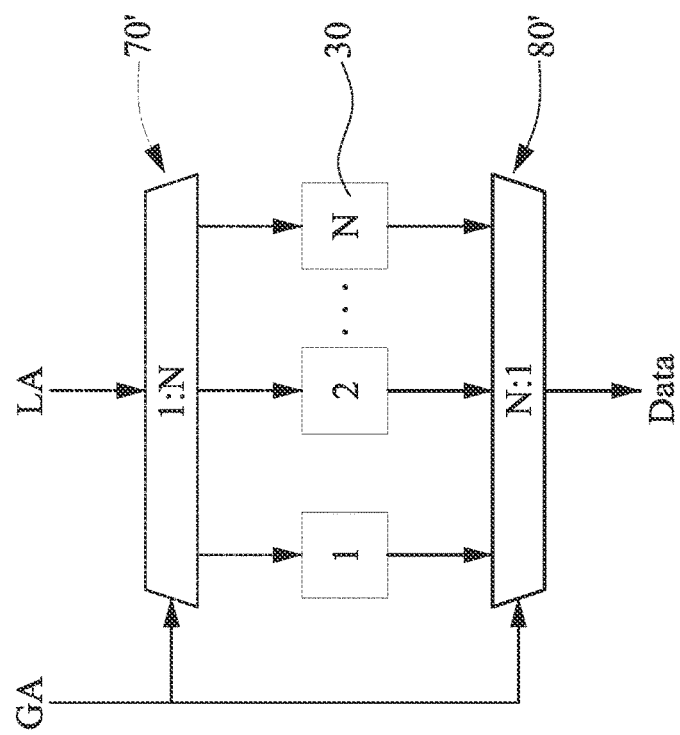
FIG. 4 shows a portion of a 3D memory device in accordance with some embodiments of the present disclosure.
Figure 5:
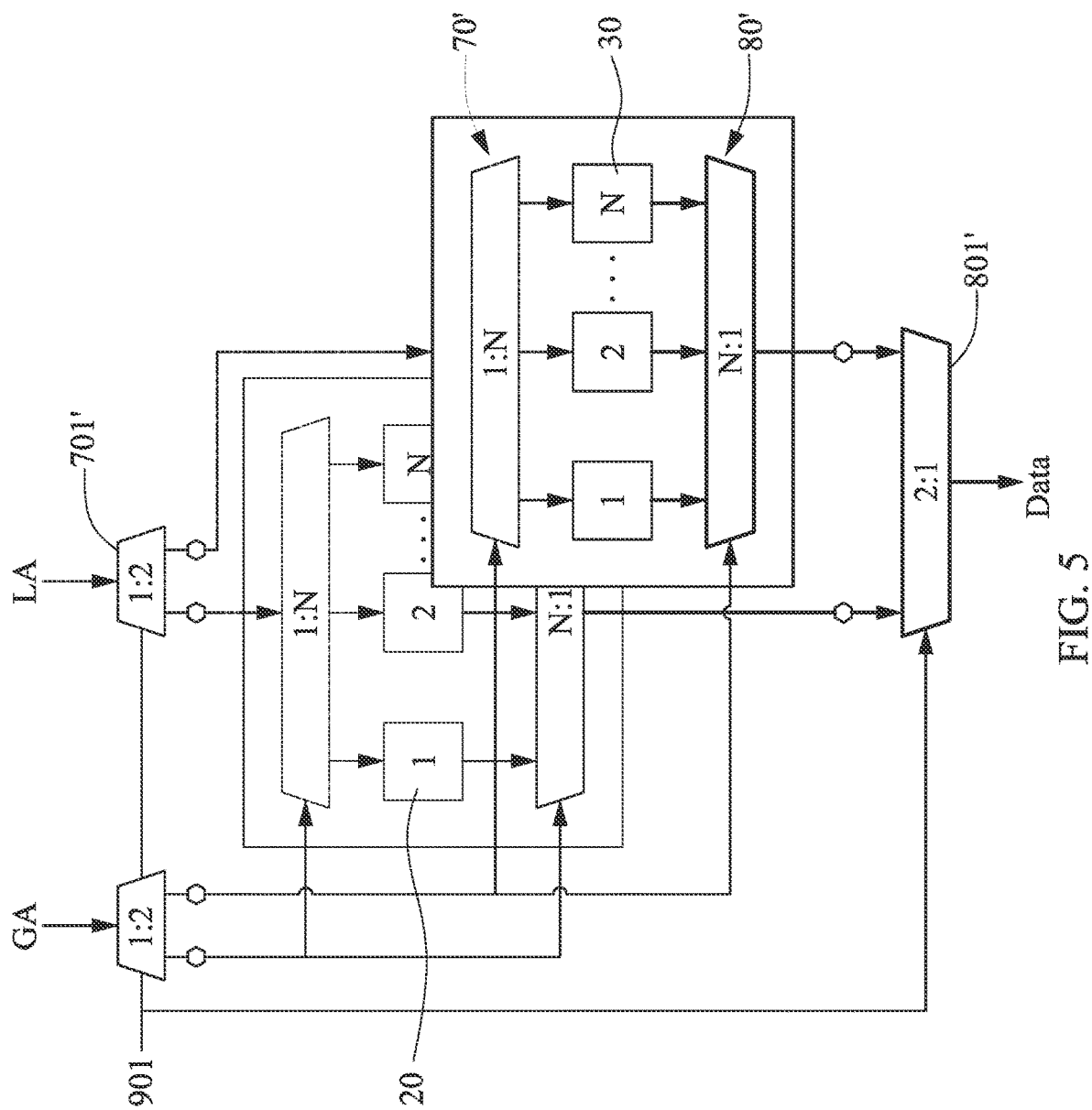
FIG. 5 shows a 3D memory device in accordance with some embodiments of the present disclosure.

In some embodiments, a first output terminal of a DEMUX 701 of the plurality of second type DEMUXs 701 is coupled to an input terminal of one of the first group of memory units 20. In some embodiments, a second output terminal of the DEMUX 701 of the plurality of second type DEMUXs 701 is coupled to an input terminal of one of the second group of memory units 30. In some embodiments, the memory units 20 and 30 are individually accessed by one of the plurality of 1-to-m DEMUXs 701 and m-to-1 MUXs 801 (rather than by the 1-to-N DEMUX 80 and N-to-1 MUX). In some embodiments, the large peripherals of the logic base layer are all located at a bottom layer (rather than being repeatedly disposed on every memory layer). In some embodiments, the large peripherals of the logic base layer can be moved to a distinct layer 101, such that the memory unit and the logic design can be disposed in different layers. In the present disclosure, there may be a shorter routing for the memory units 20 and 30 compared to existing design having a coarse-grain 3D memory device. In the present disclosure, there may be a reduced footprint compared to existing design having a coarse-grain 3D memory device. The embodiment of the structure of an existing coarse-grain 3D memory device may be shown in FIGS. 4 and 5. FIG. 4 shows a portion of a 3D memory device 4. The embodiments of a first type DEMUX 70', a first type MUX 80', and a plurality of memory units 30 of FIG. 4 are similar to those shown in FIG. 5. The embodiments of FIG. 5 shows the embodiment of an existing coarse-grain 3D memory device. In the existing design having a coarse-grain 3D memory device, each of the layers in the 3D memory device 5 needs to include a logic circuit (e.g., including the DEMUX 70' and the MUX 80') for further selecting a single memory unit from the first group of memory units 20 or the second group of memory units 30.

In some embodiments, each of the second group of memory units 30 is respectively coupled to the corresponding DEMUX 701 of the plurality of second type DEMUXs 701 through a first inter-layered interconnect 90. In some embodiments, the first inter-layered interconnect 90 is a conductive via for connecting wirings of different layers of a wafer. In some embodiments, each of the second group of memory units 30 is respectively coupled to the corresponding MUX 801 of the plurality of second type MUXs 801 through a second inter-layered interconnect 92. In some embodiments, the layer 102 and the layer 103 are selected by a selection signal 901 input to each of the plurality of second type DEMUXs 701 and each of the plurality of second type MUXs 801. In some embodiments, a first input terminal of a MUX 801 of the plurality of second type MUXs 801 is coupled to an output terminal of one of the first group of memory units 20. In some embodiments, a second input terminal of the MUX 801 of the plurality of second type MUXs 801 is coupled to an output terminal of one of the second group of memory units 30.

Figure 2:
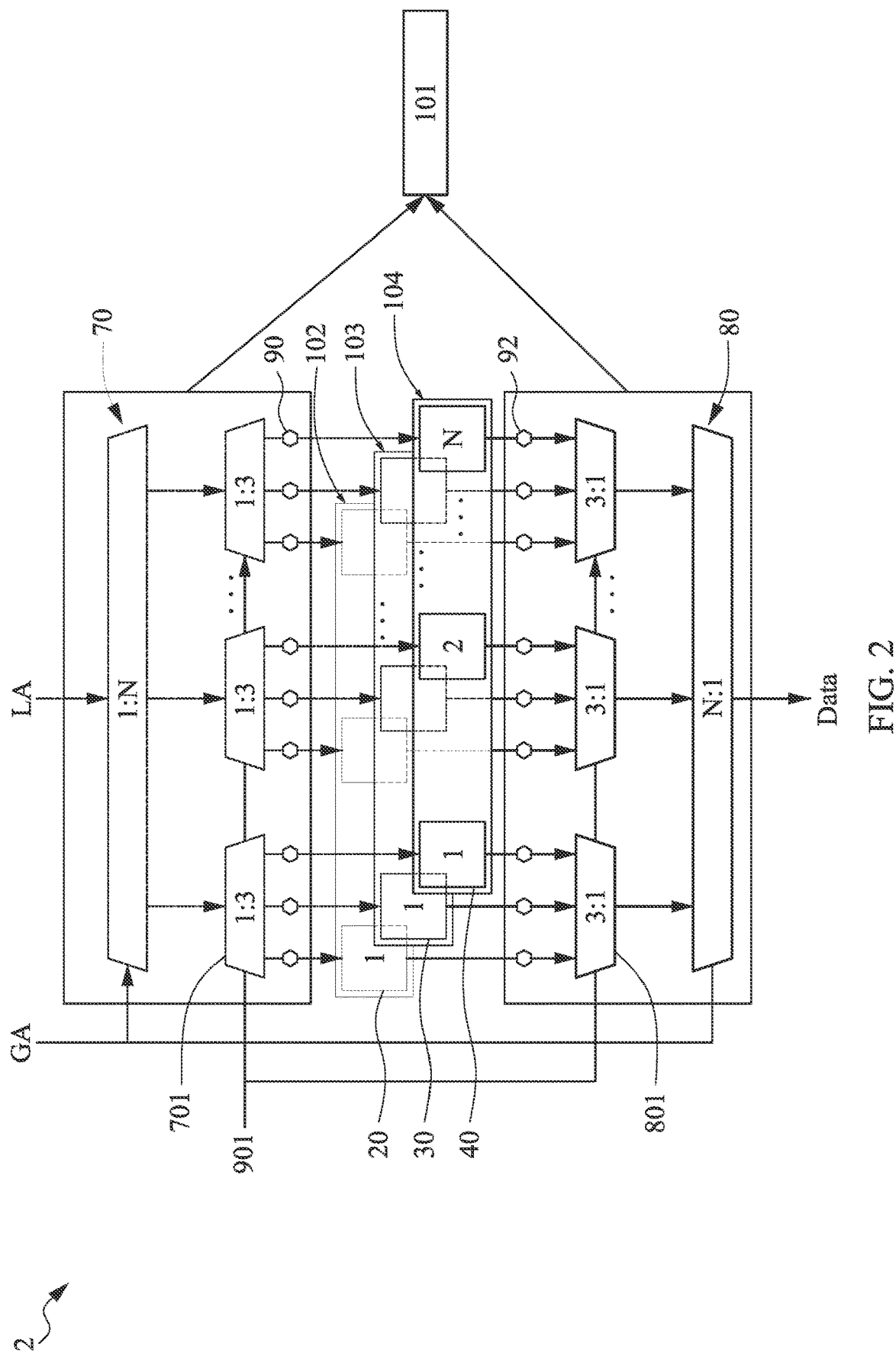
FIG. 2 shows a 3D memory device in accordance with some embodiments of the present disclosure.

FIG. 2 shows a 3D memory device 2 in accordance with some embodiments of the present disclosure. The 3D memory device 2 includes a layer 101, a layer 102 disposed on the layer 101, a layer 103 disposed on the layer 102, and a layer 104 disposed on the layer 103. In some embodiments, the layer 101 is a logic base layer having an interleave logic. In some embodiments, the layer 101 includes a first type DEMUX 70, a plurality of second type DEMUXs 701 coupled to the first type DEMUX 70, a first type multiplexer MUX 80; and a plurality of second type MUXs 801 coupled to the first type MUX 80. Each of the plurality of second type DEMUXs 701 has three output terminals and each of the plurality of second type MUXs 801 has three input terminals. In some embodiments, each of the plurality of second type DEMUXs 701 may have m number of output terminals and each of the plurality of second type MUXs 801 may have m number of input terminals. In some embodiments, m is an integer larger than 3.

In some embodiments, the layer 102 includes a first group of memory units 20. The first group of memory units 20 include a plurality of memory units. The layer 102 is a layer having memory units only. Each of the first group of memory units 20 is respectively coupled to a corresponding DEMUX 701 of the plurality of second type DEMUXs 701 and a corresponding MUX 801 of the plurality of second type MUXs 801. Each of the first group of memory units is respectively coupled to a corresponding output terminal of the m number of output terminals of the plurality of second type DEMUXs 701. In some embodiments, m is an integer larger than 3.

In some embodiments, the layer 103 includes a second group of memory units 30. The second group of memory units 30 includes a plurality of memory units. The layer 103 is a layer having memory units only. Each of the second group of memory units 30 is respectively coupled to a corresponding DEMUX 701 of the plurality of second type DEMUXs 701 and a corresponding MUX 801 of the plurality of second type MUXs 801. In some embodiments, each of the second group of memory units 30 is respectively coupled to a corresponding input terminal of the m number of input terminals of the plurality of second type MUXs 801. In some embodiments, the layer 102 and the layer 103 are selected by a selection signal 901 input to each of the plurality of second type DEMUXs 701 and each of the plurality of second type MUXs 801.

In some embodiments, the layer 104 includes a third group of memory units 40. The third group of memory units 40 includes a plurality of memory units 40. The layer 104 is a layer having memory units only. Each of the third group of memory units 40 is respectively coupled to a corresponding DEMUX 701 of the plurality of second type DEMUXs 701 and a corresponding MUX 801 of the plurality of second type MUXs 801. In some embodiments, each of the third group of memory units 40 is respectively coupled to a corresponding input terminal of the m number of input terminals of the plurality of second type MUXs 801. In some embodiments, the layer 102, the layer 103, and the layer 104 are selected by a selection signal 901 input to each of the plurality of second type DEMUXs 701 and each of the plurality of second type MUXs 801.

In some embodiments, the plurality of second type DEMUXs 701 includes N number of DEMUXs 701 and the plurality of second type MUXs 801 includes N number of MUXs 801. In some embodiments, N is the number of memory units 20. N is the number of memory units 30. N is the number of memory units 40. In some embodiments, N is an integer larger than or equal to 2. In some embodiments, the first type DEMUX 70 is a 1-to-N DEMUX and the first type MUX 80 is a N-to-1 MUX. In some embodiments, N is the number of the first group of memory units 20, the number of second group of memory units 30, and the number of third group of memory units 40. Each of the memory units 20 can be individually accessed by using the N number of 1-to-3 DEMUXs 70 and the N number of 3-to-1 MUXs 80. Each of the memory units 30 can be individually accessed by using the N number of 1-to-3 DEMUXs 70 and the N number of 3-to-1 MUXs 80. Each of the memory units 40 can be individually accessed by using the N number of 1-to-3 DEMUXs 70 and the N number of 3-to-1 MUXs 80. The large peripherals of the layer 101 are located at the bottom-most layer. In some embodiments, the logic base is moved under the memory stack including layers 102, 103, and 104.

The N number of MUXs 801 and DEMUXs 701 for the layers 102, 103, and 104 having a plurality of vertical inter-layered interconnects (TSV/SoIC bonding) may have shorter routing. The present disclosure provides a fine-grain memory device having the small peripherals (logic base layer) under the plurality of stacked memory layers, since the peripherals (logic base layer) are all located at the bottom layer.

Referring to FIG. 2, the present disclosure provides a total stack of the memory layers of 3+1 layers (that is, 3 memory layers (layers 102, 103, and 104) in addition to one logic base layer). The folded and hidden peripherals in a logic base layer are under the memory unit layer. The present disclosure keeps the large peripherals (1-to-N DEMUX and N-to-1 MUX) only at the bottom layer (i.e., layer 101). The present disclosure provides the N number of 3-to-1 MUXs 801 and the N number of 1-to-3 DEMUXs 701 for each of the stacked memory units 20, stacked memory units 30, or stacked memory units 40.

In some embodiments, each of the plurality of second type DEMUXs 701 is a 1-to-3 DEMUX and each of the plurality of second type MUXs 801 is a 3-to-1 MUX. In some embodiments, m is an integer larger than 2. In some embodiments, m is an integer of 3. In some embodiments, m is an integer corresponding to the number of the layers (layers 102, 103, and 104) disposed on the layer 101. In some embodiments, m may be 3, corresponding to the number (3)

of three layers 102, 103, and 104 disposed on the layer 101. In some embodiments, each of the plurality of second type DEMUXs 701 is a 1-to-3 DEMUX and each of the plurality of second type MUXs 801 is a 3-to-1 MUX.

In some embodiments, a first output terminal of a DEMUX 701 of the plurality of second type DEMUXs 701 is coupled to an input terminal of one of the first group of memory units 20. In some embodiments, a second output terminal of the DEMUX 701 of the plurality of second type DEMUXs 701 is coupled to an input terminal of one of the second group of memory units 30. In some embodiments, a third output terminal of the DEMUX 701 of the plurality of second type DEMUXs 701 is coupled to an input terminal of one of the third group of memory units 40. In some embodiments, a first input terminal of a MUX 801 of the plurality of second type MUXs 801 is coupled to an output terminal of one of the first group of memory units 20. In some embodiments, a second input terminal of the MUX 801 of the plurality of second type MUXs 801 is coupled to an output terminal of one of the second group of memory units 30. In some embodiments, a third input terminal of the MUX 801 of the plurality of second type MUXs 801 is coupled to an output terminal of one of the third group of memory units 40.

In some embodiments, a first output terminal of a DEMUX 701 of the plurality of second type DEMUXs 701 is coupled to an input terminal of one of the first group of memory units 20. In some embodiments, a second output terminal of the DEMUX 701 of the plurality of second type DEMUXs 701 is coupled to an input terminal of one of the second group of memory units 30. In some embodiments, a third output terminal of the DEMUX 701 of the plurality of second type DEMUXs 701 is coupled to an input terminal of one of the third group of memory units 40. In some embodiments, the memory units 20, 30, and 40 are individually accessed by one of the plurality of 1-to-3 DEMUXs 701 and one of the plurality of 3-to-1 MUXs 801 (rather than accessed by the 1-to-N DEMUX 70 and N-to-1 MUX 80). In some embodiments, the large peripherals of the logic base layer are all located at a bottom layer (rather than being repeatedly disposed on every memory layer). In some embodiments, the large peripherals of the logic base layer can be moved to a distinct layer 101, such that the memory units 20, 30, and 40 and the layer 101 can be disposed in different layers. In the present disclosure, there may be a shorter routing for the memory units 20, 30, and 40 compared to existing coarse-grain 3D memory devices. In the present disclosure, there may be a reduced footprint compared to existing coarse-grain 3D memory devices.

In some embodiments, each of the second group of memory units 30 is respectively coupled to the corresponding DEMUX 701 of the plurality of second type DEMUXs 701 through a first inter-layered interconnect 90. In some embodiments, the first inter-layered interconnect 90 is a conductive via for connecting wirings of different layers of a wafer. In some embodiments, each of the third group of memory units 40 is respectively coupled to the corresponding DEMUX 701 of the plurality of second type DEMUXs 701 through a first inter-layered interconnect 90. In some embodiments, each of the third group of memory units 40 is respectively coupled to the corresponding MUX 801 of the plurality of second type MUXs 801 through a second inter-layered interconnect 92. In some embodiments, the first inter-layered interconnect 92 is a conductive via for connecting wirings of different layers of a wafer. In some embodiments, the layers 102, 103, and 104 are selected by a selection signal 901 input to each of the plurality of second type DEMUXs 701 and each of the plurality of second type MUXs 801. In some embodiments, a first input terminal of a MUX 801 of the plurality of second type MUXs 801 is coupled to an output terminal of one of the first group of memory units 20. In some embodiments, a second input terminal of the MUX 801 of the plurality of second type MUXs 801 is coupled to an output terminal of one of the second group of memory units 30. In some embodiments, a third input terminal of the MUX 801 of the plurality of second type MUXs 801 is coupled to an output terminal of one of the third group of memory units 40. In some embodiments, the memory device 2 further comprises a first number of additional memory layers 104, wherein the first number is m−2, and wherein m is an integer larger than or equal to 2.

Figure 3:
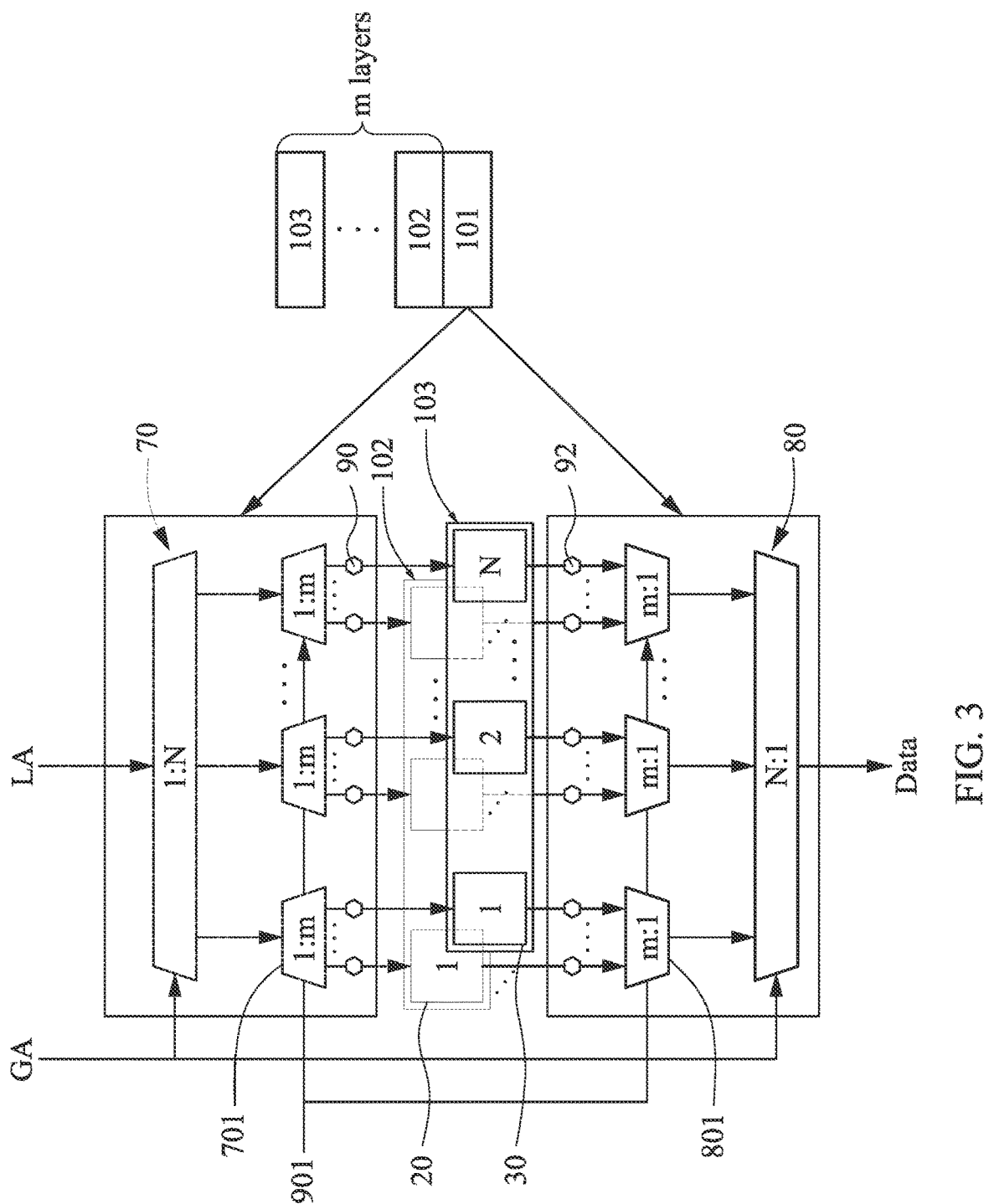
FIG. 3 shows a 3D memory device in accordance with some embodiments of the present disclosure.

FIG. 3 shows a 3D memory device 3 in accordance with some embodiments of the present disclosure. The 3D memory device 3 includes a layer 101, a (bottom memory) layer 102 disposed on the layer 101, and a (top memory) layer 103 disposed above the layer 102. In some embodiments, the total memory layers from the top memory layer 103 to the bottom memory layer 102 may have m number of layers. In some embodiments, the layer 101 is a logic base layer having an interleave logic. In some embodiments, the layer 101 includes a first type DEMUX 70, a plurality of second type DEMUXs 701 coupled to the first type DEMUX 70, a first type MUX 80; and a plurality of second type MUXs 801 coupled to the first type MUX 80. In some embodiments, each of the plurality of second type DEMUXs 701 may have m number of output terminals and each of the plurality of second type MUXs 801 may have m number of input terminals. In some embodiments, the number of output terminals of the plurality of second type DEMUXs 701 and the number of the plurality of second type MUXs 801 is larger than 2.

In some embodiments, the layer 102 includes a first group of memory units 20. The first group of memory units 20 includes a plurality of memory units. The layer 102 is a layer having memory units only. The layer 102 is disposed on the layer 101.

In some embodiments, the layer 103 includes a second group of memory units. The second group of memory units 30 includes a plurality of memory units. The layer 103 is a layer having memory units only. The layer 103 is disposed on the layer 102. In some embodiments, the 3D memory device 3 may include m number of layers, which include a plurality of memory units. In some embodiments, the 3D memory device 3 may have a total of m memory layers including memory units (that is, m memory layers in addition to one logic base layer). Each of the memory units 20 can be individually accessed by each of the 1-to-m DEMUXs 70 and each of the m-to-1 MUXs 80. The large peripherals of the layer 101 are located at the bottom-most layer. The present disclosure provides a total stack of m+1 layers (that is, m memory layers in addition to layer 101). The folded and hidden peripherals in a logic base layer are under the memory unit layer. The present disclosure keeps the large peripherals (1-to-N DEMUX and N-to-1 MUX) only at the bottom layer. The present disclosure provides N number of m-to-1 MUXs 801 and N number of 1-to-m DEMUXs 701 for each of the stacked memory units 20 or stacked memory units 30.

In some embodiments, each of the plurality of second type DEMUXs 701 is a 1-to-m DEMUX and each of the plurality of second type MUXs 801 is a m-to-1 MUX. In some embodiments, each of the plurality of second type DEMUXs

701, each of the plurality of second type MUXs 801, the first type DEMUX 70, and the first type MUX 80 are disposed in the layer 101.

In some embodiments, a DEMUX 701 of the plurality of second type DEMUXs 701 has an input terminal and m number of output terminals. In some embodiments, a MUX 801 of the plurality of second type MUXs 801 has m number of input terminals and an output terminal. In some embodiments, the memory units 20 and 30 are individually accessed by one of the plurality of 1-to-m DEMUXs 701 and one of the plurality of m-to-1 MUXs 801 (rather than directly accessed by the 1-to-N DEMUX 80 and N-to-1 MUX). In some embodiments, the large peripherals of the logic base layer are all located at a bottom layer (rather than being repeatedly disposed on every memory layer). In some embodiments, the large peripherals of the layer 101 are moved to a distinct layer 101, such that the memory units 20 and 30 and the base logic design can be disposed in different layers. In the present disclosure, there may be a shorter routing for the memory units in the m number of memory layers. The present disclosure provides a reduced footprint in a fine-grain 3D memory device.

In some embodiments, one of the plurality of 1-to-m DEMUXs 701 is coupled to the memory unit 30 through a first inter-layered interconnect 90 and one of the plurality of 1-to-m DEMUXs 701 is coupled to the memory unit 20 through a first inter-layered interconnect 90. In some embodiments, one of the plurality of m-to-1 MUXs 801 is coupled to the memory unit 30 through a second inter-layered interconnect 92 and one of the plurality of m-to-1 MUXs 801 is coupled to the memory unit 30 through a second inter-layered interconnect 92.

FIG. 4 shows a portion of a 3D memory device 4 in accordance with some embodiments of the present disclosure. The portion of the 3D memory device 4 includes a first type DEMUX 70', a first type MUX 80', and a plurality of memory units 30. The first type DEMUX 70' is coupled to each of the memory units 30. The first type MUX 80' is coupled to each of the memory units 30. The GA signal is input to the DEMUX 70' and MUX 80'. The LA signal is input to the DEMUX 70'. The data is output from the MUX 80'.

FIG. 5 shows a 3D memory device 5 in accordance with some embodiments of the present disclosure. In some embodiments, the 3D memory device 5 includes a first type DEMUX 70', a plurality of second type DEMUXs 701' coupled to the first type DEMUX 70', a first type MUX 80', and a plurality of second type MUXs 801' coupled to the first type MUX 80'. In some embodiments, each of the plurality of second type DEMUXs 701' has two output terminals and each of the plurality of second type MUXs 801' has two input terminals. The 3D memory device 5 includes a plurality of memory units 20 and 30.

Each of the second group of memory units 30 is respectively coupled to the DEMUX 70' and the MUX 80'. Each of the second group of memory units 20 is respectively coupled to the DEMUX 70' and the MUX 80'. In some embodiments, each of the DEMUXs 701' is coupled to the DEMUX 70' and each of the MUXs 801' is coupled to the MUX 80'. In some embodiments, the embodiment shown in FIG. 5 can be referred to as a coarse-grained memory device. In the coarse-grained memory device, the GA signal can only be used to select a specific layer in the 3D memory device 5. However, each of the layers in the 3D memory device 5 needs to include a logic circuit (e.g., including the DEMUX 70' and the MUX 80') for further selecting a single memory unit from the first group of memory units 20 or the second group of memory units 30.

FIG. 6 is a flowchart of an embodiment of a method 600 of manufacturing a 3D memory device 1 in accordance with some embodiments of the present disclosure. The method 600 includes providing a logic base layer 101 (operation 601). In some embodiments, the logic base layer 101 comprises a first type DEMUX 70, a plurality of second type DEMUXs 701 coupled to the first type DEMUX 70, a first type MUX 80, and a plurality of second type MUXs 801 coupled to the first type MUX 80. The method 600 includes providing a second layer 102 on the logic base layer 101 (operation 602). In some embodiments, the second layer 102 includes a first group of memory units 20, wherein each of the first group of memory units 20 is respectively coupled to a corresponding DEMUX of the plurality of second type DEMUXs 701, and wherein each of the first group of memory units 20 is respectively coupled to a corresponding MUX of the plurality of second type MUXs 801. The method 600 includes providing a third layer 103 on the second layer 102 (operation 603). In some embodiments, the third layer 103 includes a second group of memory units 30, wherein each of the second group of memory units 30 is respectively coupled to a corresponding DEMUX of the plurality of second type DEMUXs 701 and each of the second group of memory units 30 is respectively coupled to a corresponding MUX of the plurality of second type MUXs 801. In some embodiments, the first type DEMUX 70 is a 1-to-N DEMUX and the first type MUX 80 is a N-to-1 MUX, and each of the plurality of second type DEMUXs 701 is a 1-to-2 DEMUX and each of the plurality of second type MUXs 801 is a 2-to-1 MUX. In some embodiments, each of the plurality of second type DEMUXs 701 is a 1-to-3 DEMUX and each of the plurality of second type MUXs 801 is a 3-to-1 MUX. In some embodiments, each of the plurality of second type DEMUXs 701 is a 1-to-m DEMUX and each of the plurality of second type MUXs 801 is a m-to-1 MUX.

According to some embodiments, a 3D memory device is provided. The 3D memory device includes a first layer, a second layer, and a third layer. The first layer comprises a first type DEMUX, a plurality of second type DEMUXs 701 coupled to the first type DEMUX 70, a first type MUX, and a plurality of second type MUXs 801 coupled to the first type MUX. The second layer is disposed on the first layer. The second layer comprises a first group of memory units. Each of the first group of memory units is respectively coupled to a corresponding DEMUX of the plurality of second type DEMUXs and a corresponding MUX of the plurality of second type MUXs. The third layer is disposed on the second layer. The third layer comprises a second group of memory units. Each of the second group of memory units is respectively coupled to a corresponding DEMUX of the plurality of second type DEMUXs and a corresponding MUX of the plurality of second type MUXs.

According to some embodiments, a 3D memory device is provided. The 3D memory device includes a logic base layer, a first memory layer, and a second memory layer. The logic base layer comprises a first type DEMUX, and a plurality of second type DEMUXs coupled to the first type DEMUX. Each of the plurality of second type DEMUXs has m number of output terminals, a first type MUX, and a plurality of second type MUXs coupled to the first type MUX. Each of the plurality of second type MUXs has m number of input terminals. The first memory layer comprises a first group of memory units. Each of the first group of memory units is respectively coupled to a corresponding output terminal of the m number of output terminals of the plurality of second type DEMUXs. The second memory layer is disposed on the first memory layer. The second memory layer comprises a second group of memory units. Each of the second group of memory units is respectively coupled to a corresponding input terminal of the m number of input terminals of the plurality of second type MUXs, wherein m is an integer larger than or equal to 2.

According to other embodiments, a method for manufacturing a 3D memory device comprises providing a logic base layer, wherein the logic base layer comprises a first type demultiplexer (DEMUX), a plurality of second type DEMUXs coupled to the first type DEMUX, a first type multiplexer (MUX), and a plurality of second type MUXs coupled to the first type MUX, providing a second layer on the logic base layer, wherein the second layer comprises a first group of memory units, wherein each of the first group of memory units is respectively coupled to a corresponding DEMUX of the plurality of second type DEMUXs and wherein each of the first group of memory units is respectively coupled to a corresponding MUX of the plurality of second type MUXs; providing a third layer on the second layer, wherein the third layer comprises a second group of memory units, wherein each of the second group of memory units is respectively coupled to a corresponding DEMUX of the plurality of second type DEMUXs and wherein each of the second group of memory units is respectively coupled to a corresponding MUX of the plurality of second type MUXs.

The methods and features of the present disclosure have been sufficiently described in the examples and descriptions provided. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A memory device comprising:
   a first logic base layer, wherein the first logic base layer comprises:
     a first type demultiplexer (DEMUX);
     a plurality of second type DEMUXs coupled to the first type DEMUX;
     a first type multiplexer (MUX); and
     a plurality of second type MUXs coupled to the first type MUX;
   a second layer disposed on the first logic base layer, wherein the second layer comprises:
     a first group of memory units, wherein each of the first group of memory units is respectively coupled to a corresponding DEMUX of the plurality of second type DEMUXs and a corresponding MUX of the plurality of second type MUXs;
   a third layer disposed on the second layer, wherein the third layer comprises:
     a second group of memory units, wherein each of the second group of memory units is respectively coupled to a corresponding DEMUX of the plurality of second type DEMUXs and a corresponding MUX of the plurality of second type MUXs.

2. The memory device of claim 1, wherein the plurality of second type demultiplexers include a N number of demultiplexers and the plurality of second type multiplexers include a N number of multiplexers.

3. The memory device of claim 1, wherein the first type DEMUX is a 1-to-N DEMUX and the first type MUX is a N-to-1 MUX.

4. The memory device of claim 1, wherein each of the plurality of second type DEMUXs is a 1-to-2 DEMUX and each of the plurality of second type MUXs is a 2-to-1 MUX.

5. The memory device of claim 1, wherein
   a first output terminal of a DEMUX of the plurality of second type DEMUXs is coupled to an input terminal of one of the first group of memory units, and
   a second output terminal of the DEMUX of the plurality of second type DEMUXs is coupled to an input terminal of one of the second group of memory units.

6. The memory device of claim 5, wherein
   a first input terminal of a MUX of the plurality of second type MUXs is coupled to an output terminal of one of the first group of memory units, and
   a second input terminal of the MUX of the plurality of second type MUXs is coupled to an output terminal of one of the second group of memory units.

7. The memory device of claim 1, wherein each of the second group of memory units is respectively coupled to the corresponding DEMUX of the plurality of second type DEMUXs through a first inter-layered interconnect.

8. The memory device of claim 1, wherein each of the second group of memory units is respectively coupled to the corresponding MUX of the plurality of second type MUXs through a second inter-layered interconnect.

9. The memory device of claim 1, wherein the second layer and the third layer are selected by a selection signal input to each of the plurality of second type DEMUXs and each of the plurality of second type MUXs.

10. A memory device comprising:
    a logic base layer, wherein the logic base layer comprises:
      a first type demultiplexer (DEMUX);
      a plurality of second type DEMUXs coupled to the first type DEMUX, wherein each of the plurality of second type DEMUXs has m number of output terminals;
      a first type multiplexer (MUX); and
      a plurality of second type MUXs coupled to the first type MUX, wherein each of the plurality of second type MUXs has m number of input terminals;
    a first memory layer disposed on the logic base layer, wherein the first memory layer comprises:
      a first group of memory units, wherein each of the first group of memory units is respectively coupled to a corresponding output terminal of the m number of output terminals of the plurality of second type DEMUXs;
    a second memory layer disposed on the first memory layer, wherein the second memory layer comprises:
      a second group of memory units, wherein each of the second group of memory units is respectively coupled to a corresponding input terminal of the m number of input terminals of the plurality of second type MUXs, wherein m is an integer larger than or equal to 2.

11. The memory device of claim 10, further comprising a first number of additional memory layers, wherein the first number is m−2.

12. The memory device of claim 10, wherein the first type DEMUX is a 1-to-N DEMUX and the first type MUX is a N-to-1 MUX.

13. The memory device of claim 10, wherein each of the plurality of second type DEMUXs is a 1-to-m DEMUX and each of the plurality of second type MUXs is a m-to-1 MUX.

14. The memory device of claim 10, wherein a first output terminal of a DEMUX of the plurality of second type DEMUXs is coupled to an input terminal of one of the first group of memory units, and a second output terminal of the DEMUX of the plurality of second type DEMUXs is coupled to an input terminal of one of the second group of memory units.

15. The memory device of claim 14, wherein a first input terminal of a MUX of the plurality of second type MUXs is coupled to an output terminal of one of the first group of memory units, and a second input terminal of the MUX of the plurality of second type MUXs is coupled to an output terminal of one of the second group of memory units.

16. The memory device of claim 10, wherein each of the second group of memory units is respectively coupled to a corresponding DEMUX of the plurality of second type DEMUXs through a first inter-layered interconnect.

17. The memory device of claim 10, wherein each of the second group of memory units is respectively coupled to a corresponding MUX of the plurality of second type MUXs through a second inter-layered interconnect.

18. The memory device of claim 10, wherein the second layer and the third layer are selected by a selection signal being input to each of the plurality of second type DEMUXs and each of the plurality of second type MUXs.

19. A method for manufacturing a memory device comprising:
providing a logic base layer, wherein the logic base layer comprises:
a first type demultiplexer (DEMUX);
a plurality of second type DEMUXs coupled to the first type DEMUX;
a first type multiplexer (MUX); and
a plurality of second type MUXs coupled to the first type MUX;
providing a second layer on the logic base layer, wherein the second layer comprises:
a first group of memory units, wherein each of the first group of memory units is respectively coupled to a corresponding DEMUX of the plurality of second type DEMUXs and wherein each of the first group of memory units is respectively coupled to a corresponding MUX of the plurality of second type MUXs;
providing a third layer on the second layer, wherein the third layer comprises:
a second group of memory units, wherein each of the second group of memory units is respectively coupled to a corresponding DEMUX of the plurality of second type DEMUXs and wherein each of the second group of memory units is respectively coupled to a corresponding MUX of the plurality of second type MUXs.

20. The method of claim 19, wherein the first type DEMUX is a 1-to-N DEMUX and the first type MUX is a N-to-1 MUX; and wherein each of the plurality of second type DEMUXs is a 1-to-2 DEMUX and each of the plurality of second type MUXs is a 2-to-1 MUX.

* * * * *